United States Patent
Zhai

(10) Patent No.: US 10,664,018 B1
(45) Date of Patent: May 26, 2020

(54) FOLDABLE DISPLAY DEVICE

(71) Applicant: Shanghai Tianma AM-OLED Co., Ltd., Shanghai (CN)

(72) Inventor: Yingteng Zhai, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/459,502

(22) Filed: Jul. 1, 2019

(30) Foreign Application Priority Data

Nov. 30, 2018 (CN) .......................... 2018 1 1457107

(51) Int. Cl.
H05K 5/00 (2006.01)
H05K 5/02 (2006.01)
G06F 1/16 (2006.01)

(52) U.S. Cl.
CPC ......... G06F 1/1652 (2013.01); H05K 5/0017 (2013.01); H05K 5/0217 (2013.01)

(58) Field of Classification Search
None
See application file for complete search history.

(56) References Cited

U.S. PATENT DOCUMENTS

| 9,826,626 | B2 * | 11/2017 | Myeong | H04M 1/0268 |
| 9,841,050 | B2 * | 12/2017 | Hsu | F16C 11/04 |
| 9,857,832 | B2 * | 1/2018 | Kim | G06F 1/1616 |
| 9,930,794 | B2 * | 3/2018 | Luan | H05K 5/0217 |
| 2012/0307423 | A1 * | 12/2012 | Bohn | G06F 1/1641 361/679.01 |
| 2013/0010405 | A1 * | 1/2013 | Rothkopf | H04M 1/0216 361/679.01 |
| 2015/0325804 | A1 * | 11/2015 | Lindblad | G06F 3/0362 313/511 |
| 2016/0299532 | A1 * | 10/2016 | Gheorghiu | G06F 1/1652 |
| 2017/0142847 | A1 * | 5/2017 | Park | H05K 5/0017 |
| 2018/0101200 | A1 * | 4/2018 | Myeong | G02F 1/133305 |
| 2018/0124937 | A1 | 5/2018 | Choi et al. | |
| 2018/0145269 | A1 * | 5/2018 | Myeong | G06F 1/1652 |

FOREIGN PATENT DOCUMENTS

CN 105679189 A 6/2016

* cited by examiner

*Primary Examiner* — Daniel P Wicklund
*Assistant Examiner* — Christopher L Augustin
(74) *Attorney, Agent, or Firm* — Alston & Bird LLP

(57) ABSTRACT

A foldable display device includes a foldable display panel and its support plate. The support plate includes a folding area and a non-folding area, arranged in a X direction. The folding area includes a plurality of connecting units, the connecting units are arranged in the X direction and extend in the Y direction, which is perpendicular to the X direction. Adjacent connecting units are connected to each other. The width of each connecting unit in the Y direction is gradually decreased. The foldable display device further includes a buffer layer, disposed between the foldable display panel and the plurality of connecting units, and an anti-stretch film above the buffer layer.

9 Claims, 6 Drawing Sheets

FOLDABLE DISPLAY DEVICE

CROSS-REFERENCE TO RELATED APPLICATIONS

This application claims priority to a Chinese patent application No. CN201811457107.3 filed on Nov. 30, 2018, the disclosure of which is incorporated herein by reference in its entirety.

TECHNICAL FIELD

Present disclosure relates to foldable display technology, and in particular, relates to a foldable display device.

BACKGROUND

The foldable display device provides a large display screen in a working state, and takes up less space in an idle state, thereby providing excellent user experiences.

In a related art, the foldable display device includes a foldable display panel and a support plate for supporting the foldable display panel, and the support plate includes a folding area and a non-folding area. While the folding area is provided with a plurality of strip-shaped connecting units arranged in parallel, the widths of the connecting units are gradually reduced along a direction that the foldable display panel is directed toward the support plate. The foldable display panel is in contact with the support plate, during the bending of the foldable display device, the foldable display panel and the support plate are both being stretched, and the bent portion is subjected to tensile stress. When an external force hits the above-mentioned bent portion, the foldable display panel has poor impact resistance and is easily damaged.

SUMMARY

The present disclosure provides a foldable display device for improving the impact resistance of a bent portion of a foldable display device during bending.

Embodiments of the present disclosure provide a foldable display device including: a foldable display panel and a support plate for supporting the foldable display panel.

The support plate includes a folding area and a non-folding area, and the folding area and the non-folding area are aligned along a first direction.

The folding area includes many connecting units, the connecting units are arranged in the first direction and extending in a second direction, the second direction is perpendicular to the first direction, and each of the connecting units is connected to a neighboring connecting unit. Along a third direction, a width of in the first direction of each of the connecting units is gradually decreased, and the third direction is perpendicular to the foldable display panel and the support plate.

The foldable display device further includes a buffer layer, which is located between the foldable display panel and the connecting units.

According to the embodiment of the present disclosure, by means of providing a buffer layer disposed between the foldable display panel and the connecting units in the folding area of the support plate, when the bent portion of the foldable display device is bent by an external force, the buffer layer can buffer and absorb the impact kinetic energy, so the impact resistance of the above-mentioned bent portion is improved.

BRIEF DESCRIPTION OF DRAWINGS

Other features, objects and advantages of the present disclosure will become more apparent from a detailed description of non-restrictive embodiments with reference to the drawings.

DETAILED DESCRIPTION

To further elucidate technical means and technical effects for achieving an intended purpose of the present disclosure, the specific embodiments, structures, features and effects of a foldable display device according to the present disclosure will be described hereinafter in detail with reference to the drawings and preferred embodiments.

Embodiments of the present disclosure provide a foldable display device including: a foldable display panel and a support plate for supporting the foldable display panel.

The support plate includes a folding area and a non-folding area, and the folding area and the non-folding area are aligned along a first direction.

The folding area includes a plurality of connecting units, the plurality of connecting units are arranged in the first direction and extend in a second direction, while the second direction is perpendicular to the first direction. Adjacent connecting units are connected to each other, along a third direction, a width of each of the connecting units in the first direction is gradually decreased, and the third direction is a direction from the foldable display panel to the support plate.

The foldable display device further includes a buffer layer, and the buffer layer is disposed between the foldable display panel and the connecting units and.

According to the embodiments of the present disclosure, a buffer layer is disposed between the foldable display panel and the connecting units in the folding area of the support plate, attenuates and absorb the impact kinetic energy when the bent portion of the foldable display device is bent by an external force, therefore improving the impact resistance of the bent portion.

The embodiments of the present disclosure will be described clearly and completely in conjunction with the drawings. Based on the embodiments, variations in details obtained by those skilled in the art without creative work are within the scope of the present disclosure.

Details are set forth below to facilitate a thorough understanding of the present disclosure. The disclosure is not limited by the specific embodiments described below.

When the embodiments of the present disclosure are described in detail, for convenience of explanation, the schematic diagram illustrating the structure of the device may not be partially enlarged in accordance with the general scale. In addition, practical manufacturing may include three-dimension spatial sizes: length, width and height.

Figure 1:
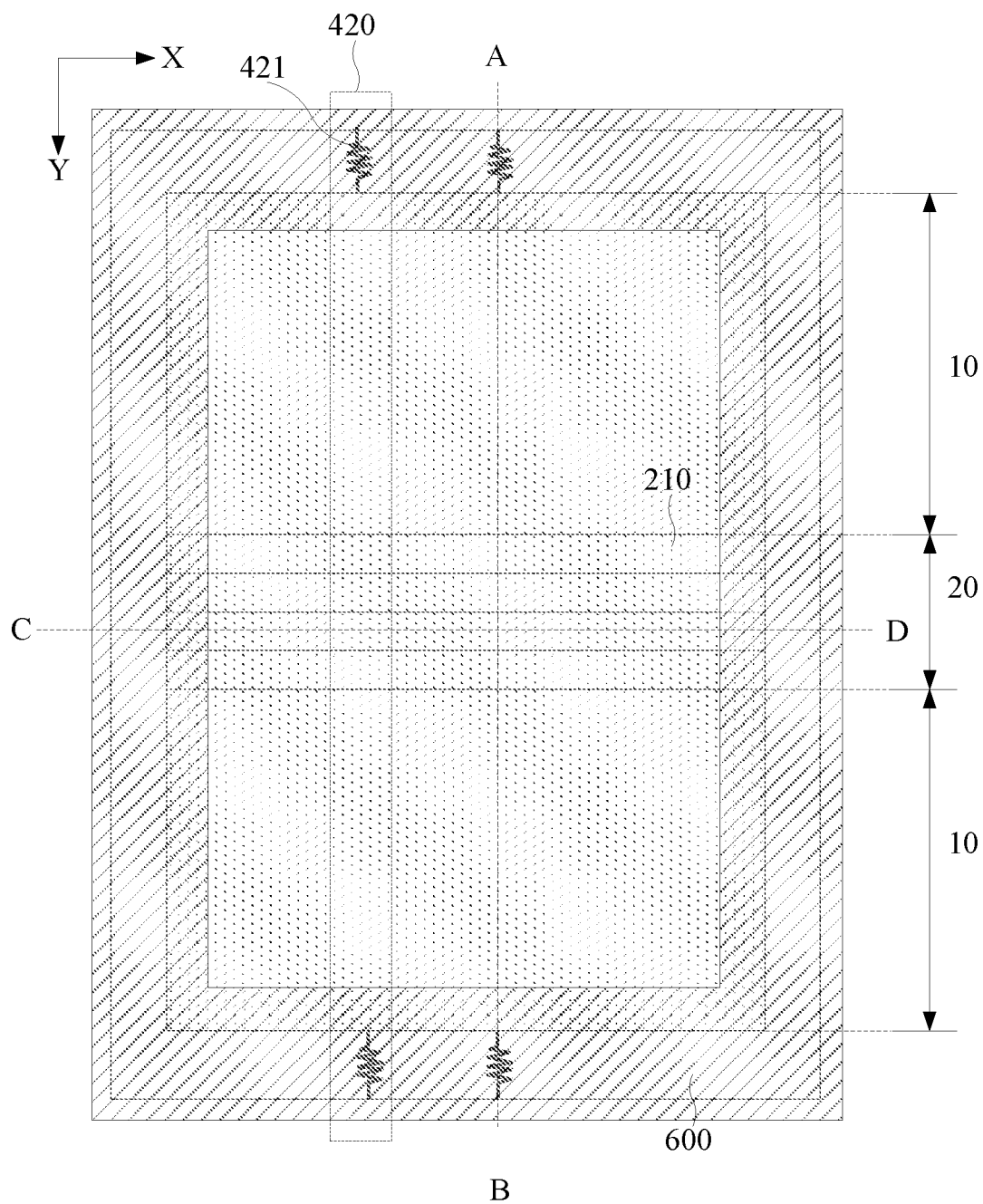
FIG. 1 is a top view showing structures of a foldable display device according to an embodiment of the present disclosure.
Figure 2:
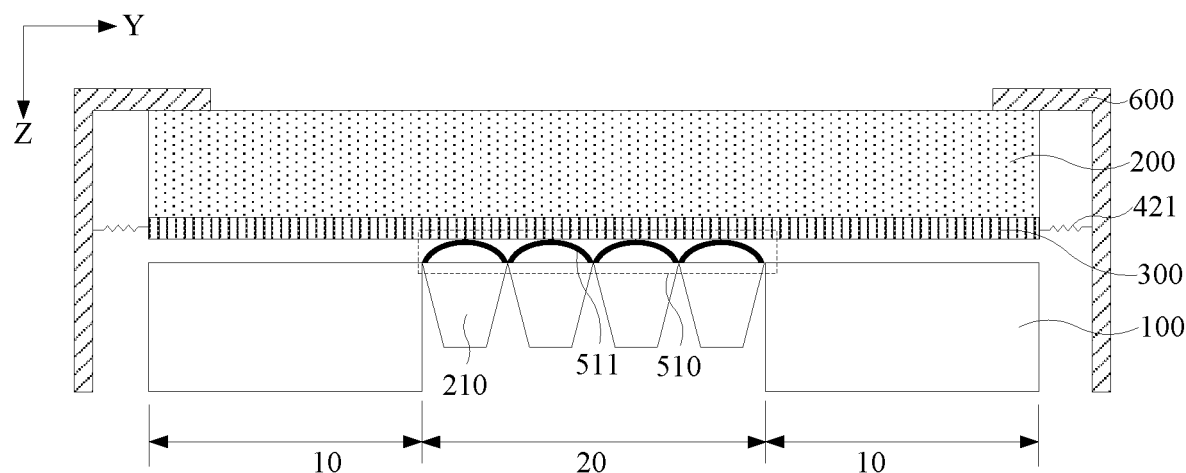
FIG. 2 is a cross sectional view taken along a dotted line A-B in FIG. 1.

FIG. 1 is a top view showing the structure of a foldable display device according to an embodiment of the present disclosure. FIG. 2 is a cross sectional view taken along a dotted line A-B in FIG. 1. Referring to FIG. 2, the foldable display device includes a foldable display panel 200 and a support plate 100 for supporting the foldable display panel 200. The support plate 100 includes a folding area 20 and an unfolding area 10, the folding area 20 and the unfolding area 10 are arranged along a first direction Y, and the folding area 20 includes a number of connecting units 210, only four are shown in the figures. As shown in FIG. 1, the plurality of connection units 210 is arranged along the first direction Y and each of them extends along a second direction X. The second direction X is perpendicular to the first direction Y. Adjacent connecting units 210 are physically attached to each other on their long sides. Still referring to FIG. 2, along a third direction Z in the cross section, the widths of the connecting unit 210 in the first direction Y is gradually decreasing, and Z axis is perpendicular to the foldable display panel 200 and the support plate 100. The foldable display device further includes a buffer layer 510, and the buffer layer 510 is disposed between the plurality of the connecting units 210 and the foldable display panel 200.

Referring to FIG. 1 and FIG. 2, the foldable display device further includes a housing 600 for protecting the foldable display panel 200 from damage. In order to simplify the drawings, FIG. 1 and FIG. 2 merely show a part of the structure of the housing 600. In practical applications, the overall structure of the foldable display panel 200 and the support plate 100 is disposed in the accommodating space of the housing 600.

It should be noted that the folding area 20 of the support plate 100 is disposed opposite to the bending area of the foldable display panel 200, so that the foldable display device can achieve a normal bending function. In addition, as shown in FIG. 2, each connecting unit 210 is wide at the top and narrow at the bottom, such that the folding area 20 of the support plate 100 has a bending angle limit when bent, preventing excessive bending to cause damage to the internal components of the supported foldable display panel 200. On the other hand, when the foldable display device is bent, the stress in the folding area of the support plate can be reduced.

Additionally, it should be noted that, the buffer layer 510 is a buffer film layer, and it may be contacting the connection units 210 or may be merely placed over the connection units 210, but not contacting the connection units 210. It should be noted that the buffer layer 510 may have various structures, for example, a full-layer film structure, or a structure including many sub-sections as shown in FIG. 2.

According to the embodiments of the present disclosure, a buffer layer 510 between the foldable display panel 200 and the plurality of connecting units 210 in the folding area 20 of the support plate 100, can reduce and absorb the impact kinetic energy, when the bent portion of the foldable display device is bent by an external force, the buffer layer 510, so the impact resistance of the above-mentioned bent portion is improved.

The elastic modulus of the buffer layer 510 is smaller than 0.01 GP.

It should be noted that the buffer layer 510 formed by a material with a smaller than 0.01 GP elastic modulus is susceptible to deformation, low rigidity, therefore good buffering and kinetic energy absorption capability. Therefore, the elastic modulus of the cushion material in this embodiment is preferably set to be less than 0.01 GP.

As is shown in FIG. 2, the buffer layer 510 may include a number of buffer units 511 aligned with connection unit 210, so each of them has an one-to-one correspondence with one connection unit 210, and projections along z-axis of one buffer unit 511 falls within the projection of one respective connecting unit 210 on the foldable display panel 200.

It should be noted that, in such an arrangement, the buffer layer 510 is avoided to be disposed at the contacting position of the adjacent connection units 210, thereby preventing the buffer layer 510 from increasing the bending resistance of the folding area 20 of the support plate 100 during the bending of the foldable display device.

The buffer unit 511 can be a rubber mat.

It should be noted that the cushioning performance of the rubber pad is good and the cost is low, which is a preferred choice of the buffer unit 511 in this embodiment. It can be understood that, in other mode of the embodiments, the buffer unit 511 may also be other buffer material.

Referring to FIG. 2, the surface of the buffer units 511 facing the foldable display panel 200 may be curved.

It should be noted, in such an arrangement, a gap exists between the adjacent buffer units 511, and the gap can accommodate a micro-deformation of the buffer units 511 on both sides, thereby enhancing the stress release capability of the buffer layer 510.

Still referring to FIG. 2, each buffer unit 511 can be a hollow structure.

It should be noted that, by employing such an arrangement, a buffer space is formed between each buffer unit 511 and its corresponding connecting unit 210, which further enhances the stress release capability of the buffer layer 510.

Figure 3:
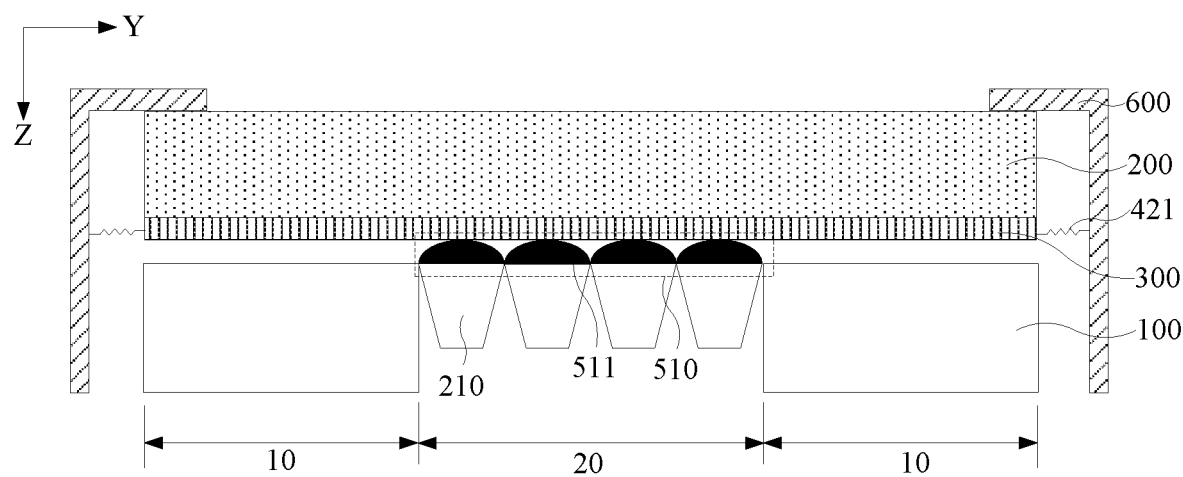
FIG. 3 is another cross sectional view taken along a dotted line A-B in FIG. 1 when the buffer unit has a solid filled structure.

There are variations of the buffer layer which share the same top view of FIG. 1. FIG. 3 is another cross sectional view taken along a dotted line A-B in a different buffer layer structure under the same top view of FIG. 1. Although the structure of the foldable display device shown in FIG. 3 is similar to that of the foldable display device shown in FIG. 2, the buffer unit 511 in the foldable display device of FIG. 3 has a solid filled structure.

It should be noted that the buffer unit 511 of solid filled structure is easier to prepare, reducing the cost in preparing the foldable display device.

As is shown in FIG. 3, each connecting unit 210 may be a block structure.

It should be noted that the supporting force for the connecting units 210 of the block structure in Z axis is quite large, which is beneficial to achieve effective support of the support panel 100 for the foldable display panel 200.

Figure 4:
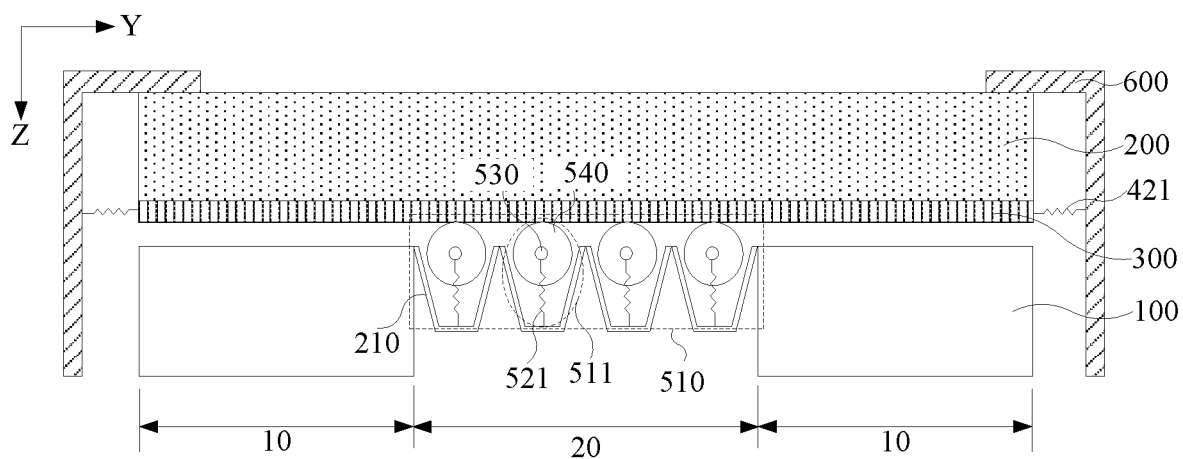
FIG. 4 is another cross sectional view taken along a dotted line A-B in FIG. 1 when the connecting units have grooved structures.

Optionally, FIG. 4 is another cross sectional view taken along a dotted line A-B for another different buffer layer structure under the same top view of FIG. 1. As shown in FIG. 4, the connecting units 210 in the foldable display device have grooved structures.

It should be noted that, in such an arrangement, the buffer units 511 disposed between the connecting units 210 and the foldable display panel occupy more buffering space, which is beneficial to releasing stress from bending. The weight of the support plate 100, and also the overall weight of the foldable display device is reduced.

Figure 5:
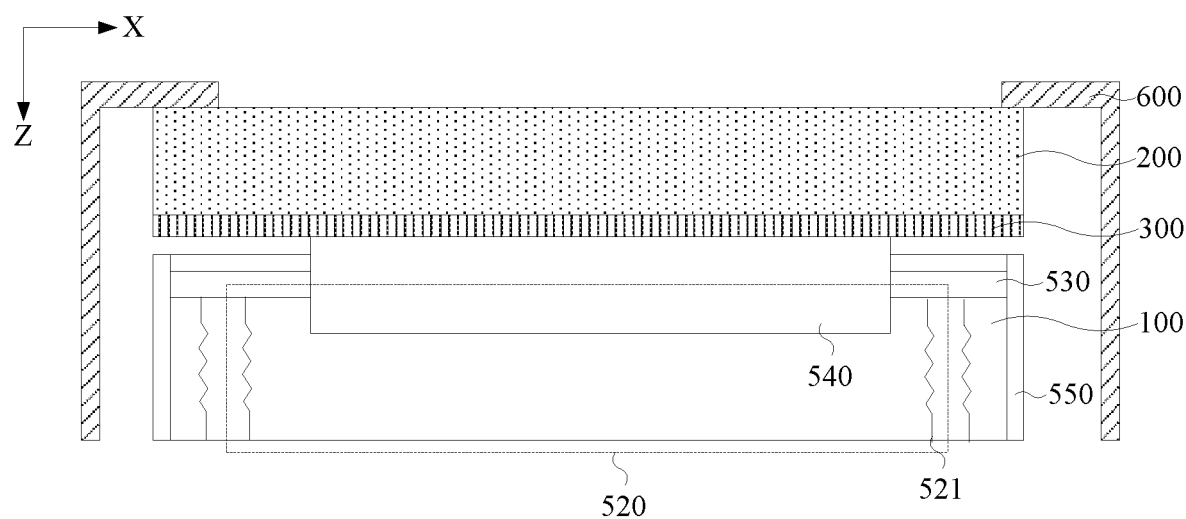
FIG. 5 is a cross sectional view taken along a dotted line C-D in FIG. 1.

Further, still referring to FIG. 4, when the connecting units 210 have grooved structures, the buffer units 511 are located at least in part in the grooves of the connecting units 210. FIG. 5 is a cross sectional view taken along a dotted line C-D in FIG. 1. As shown in FIG. 4 and FIG. 5, each of the buffer units 511 includes a roller 540, a rolling central rod 530 of the roller 540 and at least one first spring group 520. The first spring group 520 includes two first springs 521 each disposed on opposite ends of the roller 540, the first springs 521 extend in the third direction Z, and the two ends of each first spring 521 are respectively connected to the rolling rod 530 and one connecting unit 210. Still referring to FIG. 5, the foldable display device further includes two rolling rod slide rails 550, two rolling rod slide rails 550 are disposed on opposite sides of each rolling rod 530, and are respectively fitted with the ends of corresponding rolling rod 530, and the rolling rod slide rails 550 extend along Z axis for use as a sliding track for the rolling rod 530.

Figure 6:
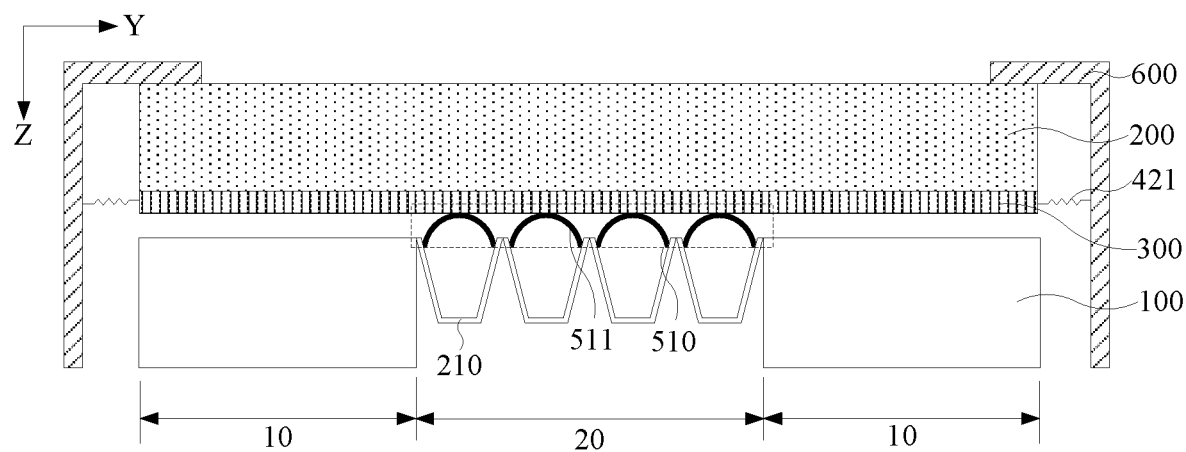
FIG. 6 is another cross sectional view taken along a dotted line A-B in FIG. 1 when the buffer unit has an arc structure.

It should be noted that, by employing such an arrangement, the weight of the connecting units 210 can be reduced and the buffering function can be achieved, thereby reducing the overall weight of the foldable display device. It can be understood that, in other implement modes of the embodiment, when the connecting unit 210 has a grooved structure, the buffer units 511 may also have other buffer structures, for example, the arc structure adopted in FIG. 2, which is shown in FIG. 6.

It should be noted that FIG. 5 merely illustrates the buffer units 511 including two first spring groups 520 as an example and is not limited thereto, in other implement modes of the embodiment, the buffer units 511 may also include other numbers of the first spring groups 520, which is not specifically limited in this embodiment. In addition, the grooves may penetrate the connecting units 210 in the second direction X or may not penetrate the connecting units 210, and at this moment, the connecting units 210 include two side walls respectively disposed on the two sides of each groove in the second direction X. In the former case, the rolling rod slide rail 550 can be disposed on the housing 600 of the foldable display device. In the latter case, the sliding rod slide rails may be disposed on the two side walls of the connecting unit 210, which is shown in FIG. 5

Still referring to FIGS. 1 and 2, the foldable display device may further include an anti-stretch film 300 attached to one side of the foldable display panel 200 near the support plate 100, and at least one second spring group 420, wherein each of the second spring groups 420 includes two second springs 421 on opposite ends of the anti-stretch film 300 in the first direction Y, and the second spring 421 extends in the first direction Y, one end of the second spring 421 is connected to the anti-stretch film 300, and the other end is connected to the side wall of the housing 600 of the foldable display device.

It should be noted that the anti-stretch film 300 has good tensile strength and is not easily deformed by stretching. During the bending of the foldable display device, the anti-stretch film 300 is undeformed, so that the bent portion of the foldable display panel 200 that is in contact with the anti-stretch film 300 is not deformed by stress, and thus the bent portion of foldable display device is not easily damaged by an external force. Furthermore, to ensure that the anti-stretch film 300 does not affect the normal bending of the foldable display panel 200, at least one second spring group 420 is provided, the second spring 421 of the second spring group 420 can be stretched during the bending of the display device, such that the foldable display device achieves effective bending without the foldable display panel 200 being stretched It should be noted that the connection between the second spring 421 and the anti-stretch film 300 can be achieved by using a double-ended clip. Specifically, the first collet of the double-ended clip clamps the corresponding end of the second spring 421, and the second collet clamps the anti-stretch film 300. It can be understood that any way to achieve effective connection between the second spring 421 and the anti-stretch film 300 is within the protection scope of the embodiment, and no more examples are described herein again.

It should be noted that FIG. 1 merely shows the foldable display device including two second spring groups 420, which is illustrative and not limitation. In other implement modes of the embodiment, the number of the second spring groups 420 may also be other values, which is not specifically defined in this embodiment.

Optionally, the material of the anti-stretch film 300 may have an elastic modulus being greater than 10 GP.

It should be noted that, ideally, the foldable display panel 200 does not undergo tensile deformation during the bending of the foldable display device. Therefore, the deformation of the anti-stretch film 300 is as difficult as possible, and the elastic modulus of the material forming the anti-stretch film 300 is preferably as large as possible. Depending on the actual application herein, the elastic modulus of the material of the anti-stretch film 300 is preferably set to be greater than 10 GP.

It should be noted that, FIG. 1 to FIG. 6 are merely illustrative and not limited to the case where the folding area 20 of the support plate 100 includes four connecting units 210. In other implement modes of the embodiment, the folding area 20 of the support plate 100 may further include other numbers of connecting units 210, which are not specifically limited in this embodiment.

It should be noted that the above are only preferred embodiments of the present disclosure and the technical principles used therein. It will be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A foldable display device, comprising:
  a foldable display panel; and
  a support plate for supporting the foldable display panel; wherein the support plate comprises a folding area and a non-folding area, wherein the folding area and the non-folding area are aligned along a first direction;
  wherein the folding area comprises a plurality of connecting units, arranged in the first direction and extending in a second direction, wherein the second direction is perpendicular to the first direction, and wherein each connecting unit of the plurality of connecting units is connected to a neighboring connecting unit; wherein along a third direction, a width in the first direction of each of the connecting units is gradually decreased, wherein the third direction is perpendicular to the foldable display panel and the support plate; and
  wherein the foldable display device further comprises a buffer layer, an anti-stretch film and at least one second spring group; wherein the buffer layer is disposed between the foldable display panel and the plurality of connecting units, the anti-stretch film is attached to one side of the foldable display panel facing the support plate, and wherein the at least one second spring group comprises two second springs, wherein the two second springs are located on opposite ends of the anti-stretch film and extend in the first direction, wherein each of the two second springs is connected to the anti-stretch film at one end, and a side wall of a housing of the foldable display device at another end.

2. The foldable display device of claim 1, wherein the buffer layer comprises a plurality of buffer units, wherein the plurality of buffer units has an one-to-one correspondence with the plurality of connecting units, a projection in the third direction of each of the plurality of buffer units falls within a projection of said respective one connecting unit on the foldable display panel.

3. The foldable display device of claim 2, wherein each of the plurality of buffer units is a rubber mat.

4. The foldable display device of claim 2, wherein a surface of each of the plurality of buffer units facing the foldable display panel is curvy.

5. The foldable display device of claim 2, wherein the each of the plurality of buffer units has a solid structure or a hollow structure.

6. The foldable display device of claim 2, wherein the each of the plurality of connecting units has a grooved structure or a block structure.

7. The foldable display device of claim 1, wherein a material of the anti-stretch film has an elastic modulus being greater than 10 Gigapascals (GP).

8. The foldable display device of claim 1, wherein a material of the buffer layer has an elastic modulus being less than 0.01 GP.

9. A foldable display device, comprising:
  a foldable display panel; and
  a support plate for supporting the foldable display panel; wherein the support plate comprises a folding area and a non-folding area, wherein the folding area and the non-folding area are aligned along a first direction;
  wherein the folding area comprises a plurality of connecting units, arranged in the first direction and extending in a second direction, wherein the second direction is perpendicular to the first direction, and wherein each connecting unit of the plurality of connecting units is connected to a neighboring connecting unit; wherein along a third direction, a width in the first direction of each of the connecting units is gradually decreased, wherein the third direction is perpendicular to the foldable display panel and the support plate; and wherein the foldable display device further comprises a buffer layer disposed between the foldable display panel and the plurality of connecting units, wherein the buffer layer comprises a plurality of buffer units, wherein the plurality of buffer units each has an one-to-one correspondence with one of the plurality of connecting units, wherein a projection in the third direction of each of the plurality of buffer units falls within a projection of said respective one connecting unit on the foldable display panel;

wherein the each of the plurality of connecting units has a grooved structure, and said each of the plurality of buffer units is located at least in part in one grooved structure of the plurality of connecting units;

wherein said each of the plurality of buffer units comprises a roller, a rolling rod of the roller and at least one first spring group, wherein the first spring group comprises two first springs disposed on opposite ends of the roller;

wherein the two first springs extend along the third direction, and the two ends of each of the two first springs are respectively connected to the rolling rod and one of the plurality of connecting units; and wherein the foldable display device further comprises two rolling rod slide rails, along the second direction, each of the two rolling rod slide rails is arranged at one end of the rolling rod to guide the rolling rod slide, along the third direction.

\* \* \* \* \*